United States Patent
Geddada et al.

(10) Patent No.: US 10,637,493 B1
(45) Date of Patent: Apr. 28, 2020

(54) DIGITAL CALIBRATION OF CAPACITIVE MISMATCHES IN ANALOG-TO-DIGITAL CONVERTERS

(71) Applicant: Avago Technologies International Sales Pte. Limited, Singapore (SG)

(72) Inventors: Hemasundar Mohan Geddada, Irvine, CA (US); Chun-Ying Chen, Irvine, CA (US); Mo Maggie Zhang, Irvine, CA (US); Zen-Che Lo, Irvine, CA (US); Massimo Brandolini, Irvine, CA (US); Pin-En Su, Irvine, CA (US); Acer Chou, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/361,618

(22) Filed: Mar. 22, 2019

(51) Int. Cl.
*H03M 1/10* (2006.01)
*H03M 1/46* (2006.01)
*H03M 1/12* (2006.01)

(52) U.S. Cl.
CPC ......... *H03M 1/1042* (2013.01); *H03M 1/468* (2013.01); *H03M 1/1071* (2013.01); *H03M 1/125* (2013.01)

(58) Field of Classification Search
CPC .. H03M 1/1042; H03M 1/468; H03M 1/1071; H03M 1/125

USPC .......................................... 341/120, 155, 144
See application file for complete search history.

(56) References Cited

U.S. PATENT DOCUMENTS

| | | | | |
|---|---|---|---|---|
| 6,094,155 A * | 7/2000 | Fees | ..................... | H03M 1/0863 327/401 |
| 6,486,816 B2 * | 11/2002 | Seymour | ............... | H03M 1/804 341/144 |
| 9,473,165 B2 * | 10/2016 | Mirhaj | ..................... | H03M 1/66 |

* cited by examiner

*Primary Examiner* — Brian K Young
(74) *Attorney, Agent, or Firm* — Xsensus LLP (57) ABSTRACT

A method and apparatus for calibrating a CDAC-based analog-to-digital converter is disclosed. In one aspect, a calibration method includes: applying a predetermined pattern of voltages to first plates of a group of N capacitors, wherein N is an integer greater than 1; applying a zero voltage to the second plates of the group of N capacitors, wherein the second plates of the group of N capacitors are connected in common; removing the zero voltage to the second plates of the group of N capacitors; applying a zero voltage to all of the first plates of the group of N capacitors; quantizing a voltage on the second plates of the group of N capacitors; converting the quantized voltage on the second plates of the group of N capacitors to an adjustment value; and loading the adjustment value into a lookup table.

20 Claims, 6 Drawing Sheets

DIGITAL CALIBRATION OF CAPACITIVE MISMATCHES IN ANALOG-TO-DIGITAL CONVERTERS

BACKGROUND

Field

This disclosure relates to the field of analog-to-digital converters, devices, components and methods.

Description of the Related Art

An analog-to-digital converter (ADC) is an electronic component that converts an analog voltage or current input to a digital output representing the magnitude of the voltage or current. ADCs are used in many modern electronic devices including video, voice and music recorders; mobile phones; computers; communications equipment; scientific instruments and data acquisition systems.

The successive approximation ADC is a popular type of analog-to-digital converter that carries out the conversion by employing a binary search through possible quantization levels before converging on a digital output. Successive approximation ADCs contain a digital-to-analog converter (DAC), a comparator, and a successive approximation register (SAR) that coordinate to execute the binary search. The capacitor-based digital-to-analog converter (CDAC) is one of the more common DACs used in integrated circuit successive approximation ADCs. ADCs that use CDACs rely on the accuracy of matching or scaling of capacitors in the CDAC. If the accuracy of this scaling (either binary or non-binary) is inadequate, distortion (nonlinearity, etc.) of the digital output may occur. This is because the weights of the digital output words change to unknown values due to inaccuracy in the scaling and/or matching of the capacitors. To correct the distortion, the real weights have to be measured and corrected.

Increasing the size of the integrated capacitors may improve the matching, but this may require significant chip area and power in the capacitor drivers for high resolution ADCs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However; the subject technology is not limited to the specific details set forth herein and may be practiced using one or more implementations. In one or more instances, structures and components are shown in simplified form in order to avoid obscuring the concepts of the subject technology.

Referring now to the drawings, wherein like reference numerals designate identical or corresponding parts throughout the several views, exemplary aspects of the disclosure include a CDAC-based successive approximation ADC calibration system and method.

Figure 1:
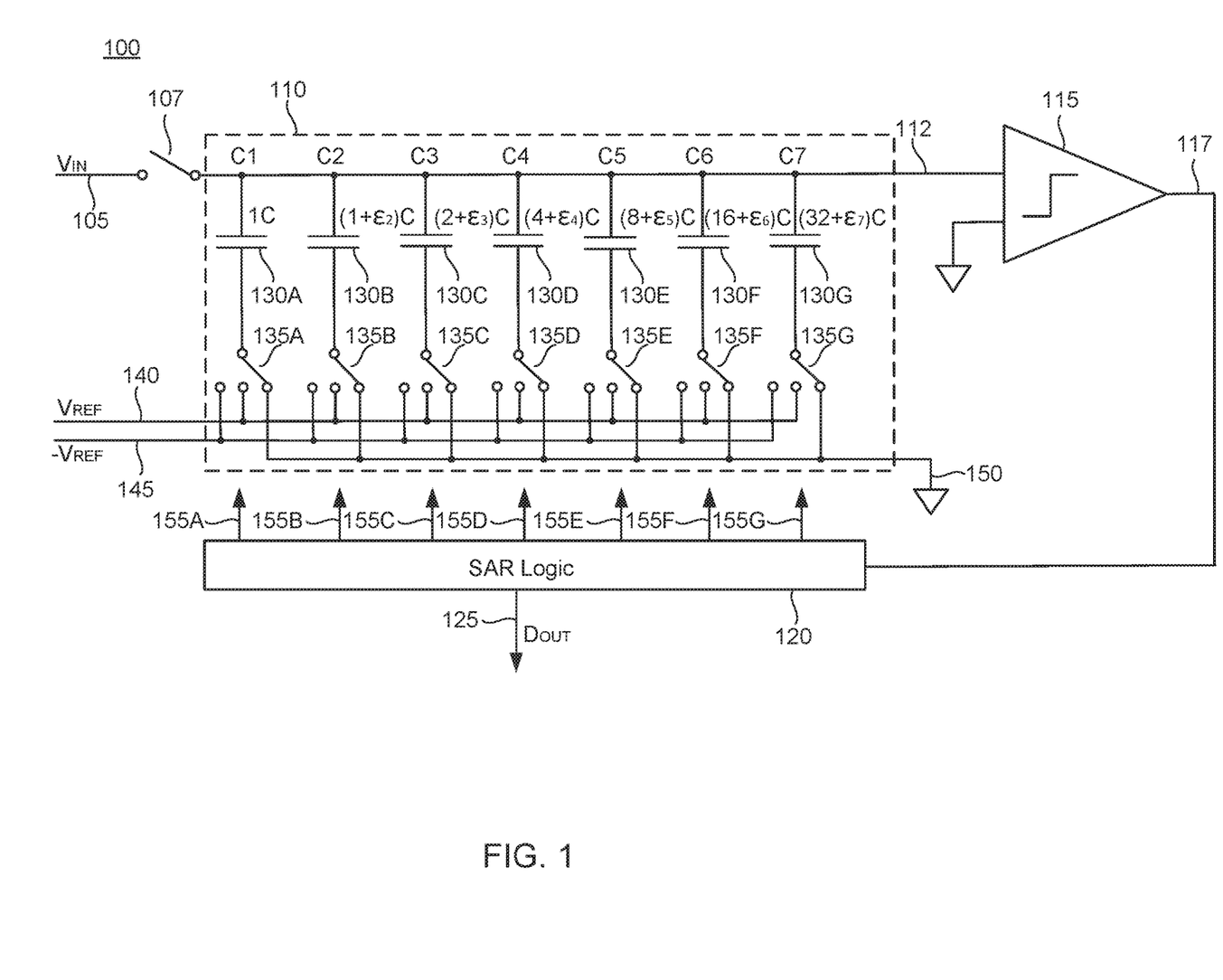
FIG. 1 illustrates a CDAC-based successive approximation ADC according to some embodiments of the present disclosure.

FIG. 1 illustrates a CDAC-based successive approximation ADC according to some embodiments of the present disclosure. In FIG. 1, an input voltage $V_{IN}$ 105 may be applied, through input switch 107, to a capacitor-based digital-to-analog converter 110 and to a comparator 115. The output 117 of comparator 115 may be connected to successive approximation register (SAR) logic 120. The successive approximation register logic 120 may provide a digital output $D_{OUT}$ 125 that may represent the digital equivalent (or approximation) of the analog input voltage $V_{IN}$ 105. At the start of typical conversion operation, input switch 107 is closed to allow input voltage $V_{IN}$ 105 to be applied to the top plate of capacitors C1-C7 (130A-130G). At the same time, 3-position switches 135A-135G may all be positioned to provide a common voltage 150 (e.g., ground) to the bottom plates of capacitors C1-C7 (130A-130G). During conversion, successive approximation register logic 120 coordinates selection signals 155A-155G to 3-position switches 135A-135G (to connect $V_{REF}$ 140, or $-V_{REF}$ 145 to the bottom plate of a corresponding capacitor C1-C7 (130A-130G)) based on comparison signal 117 from comparator 115, to find the closest digital equivalent of input voltage $V_{IN}$ 105. The 3-position switch-based CDAC functionality may be realized using a split capacitor based CDAC implementation in the hardware.

Capacitors C1-C7 (130A-130G), in an embodiment as illustrated in FIG. 1, are nominally scaled such that C2=C1, C3=2*C1, C4=4*C1, C5=8C1, C6=16*C1, and C7=32*C1 (sometimes called binary scaling). In an actual implementation, due to normal process and geometric variations, mismatches in the capacitors (differences from the nominal values) of the CDAC causes inaccuracy in the weights. As shown in FIG. 1, $\varepsilon_i$ is the error in capacitor Ci with respect to C1 ($\varepsilon_1$=0). The binary weights of the digital output words may change to unknown, non-binary values, and if not corrected, may result in distorted output and may deteriorate the digital signal purity.

While FIG. 1 illustrates a seven-bit successive approximation ADC (128 levels), those skilled in the art will readily appreciate that a successive approximation ADC with any number of bits of resolution (N) may be implemented by increasing (or decreasing) the number of capacitors, 3-position switches, and stages in the successive approximation register logic. In embodiments of the present disclosure, the number of bits of resolution (N) should be greater than one.

In an embodiment, a system and method for calibration measures and corrects the inaccuracy in the weights caused by static capacitor mismatch in a CDAC by measuring the mismatch (error) and correcting it in the digital domain by the use of a look-up table at the output of the successive approximation register logic 120. Higher levels of matching may be achieved even with smaller capacitor sizes, thus saving silicon area.

Figure 2:
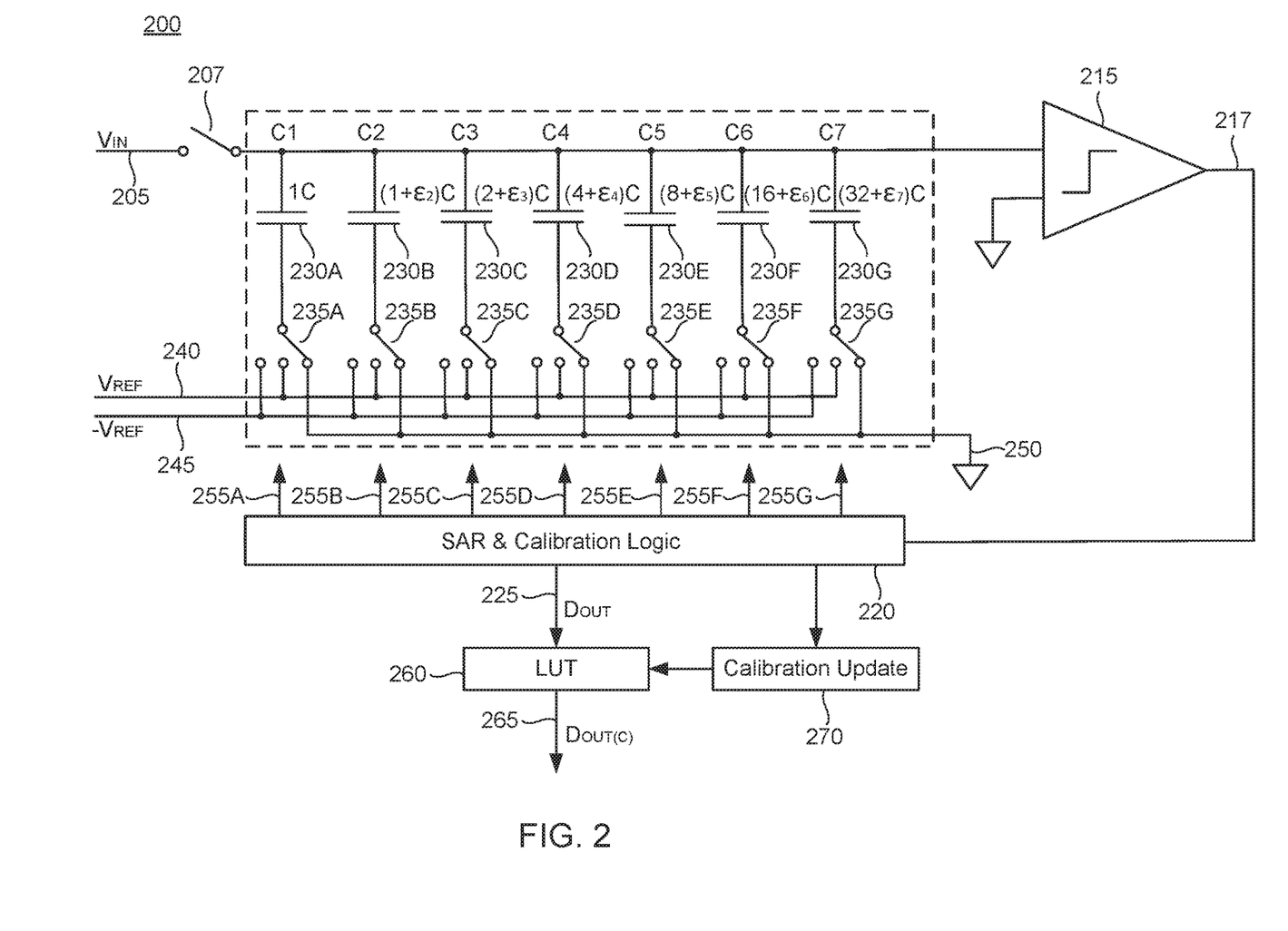
FIG. 2 illustrates another CDAC-based successive approximation ADC according to some embodiments of the present disclosure.

FIG. 2 illustrates a CDAC-based successive approximation ADC 200 according to an embodiment of the present disclosure. Referring to FIG. 2, successive approximation register and calibration logic 220 may coordinate a one-time digital calibration to measure and correct for static capacitance errors ($\varepsilon_i$). During a calibration procedure according to an embodiment of the present disclosure, successive approximation register and calibration logic 220 coordinates selection signals 255A-255G to 3-position switches 235A-235G (to connect common voltage 250. $V_{REF}$ 240, or $-V_{REF}$ 245 to the bottom plate of a corresponding capacitor C1-C7 (230A-230G)), the position of input switch 207, the input voltage $V_{IN}$ 205, along with comparison signal 217 from comparator 215, to find adjustment values to be loaded into look-up table (LUT) 260 by calibration update block 270.

Figure 3:
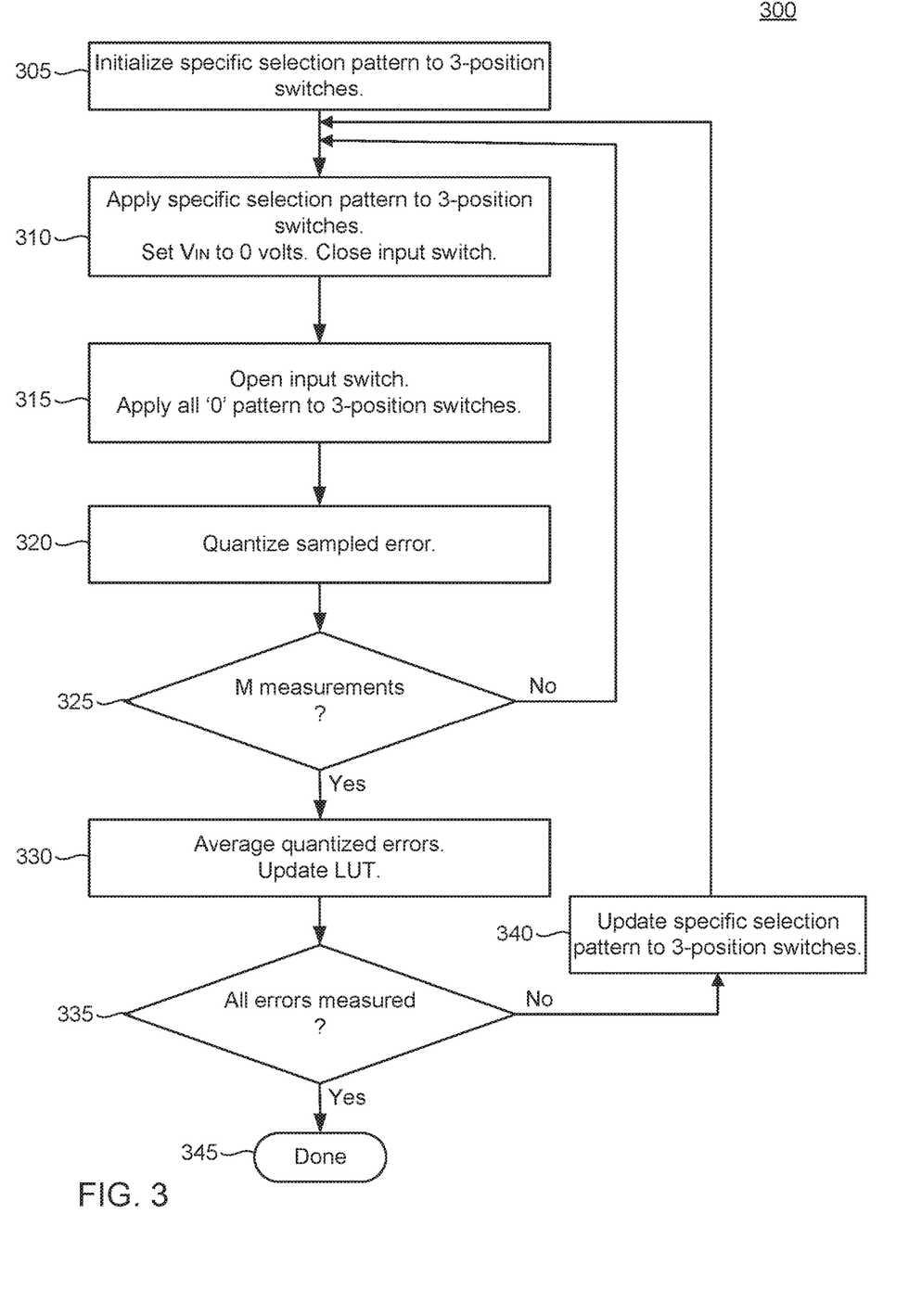
FIG. 3 illustrates a simplified flow diagram of a CDAC-based successive approximation ADC calibration procedure according to an embodiment of the present disclosure.

FIG. 3 illustrates a simplified flow diagram of a CDAC-based successive approximation ADC calibration procedure 300 according to an embodiment of the present disclosure. Calibration procedure 300 begins at step 305, where a specific selection pattern to be applied to the 3-position switches (235A-235G in FIG. 2) is initialized to a predetermined pattern. In step 310, the specific selection pattern is applied to the 3-position switches (235A-235G in FIG. 2). The specific selection pattern will cause a specific set of voltages to be applied to the bottom plates of the capacitors (C1-C7 in FIG. 2) in the CDAC. At the same time, $V_{IN}$ is set to 0 volts and the input switch (207 in FIG. 2) is closed, which applies 0 volts to the combined top plates (connected in common) of the capacitors (C1-C7 in FIG. 2). The specific voltages applied to the bottom plates of the capacitors may provide for a measurement of one of the static capacitance errors ($\varepsilon_i$). The static capacitance errors ($\varepsilon_i$) are preferably measured one at a time, in order from smallest capacitor to largest capacitor (from $\varepsilon_2$ to $\varepsilon_7$, for example). In this way, the measured error value for each capacitor may be used to measure the error value for the next capacitor in order.

Figure 4:
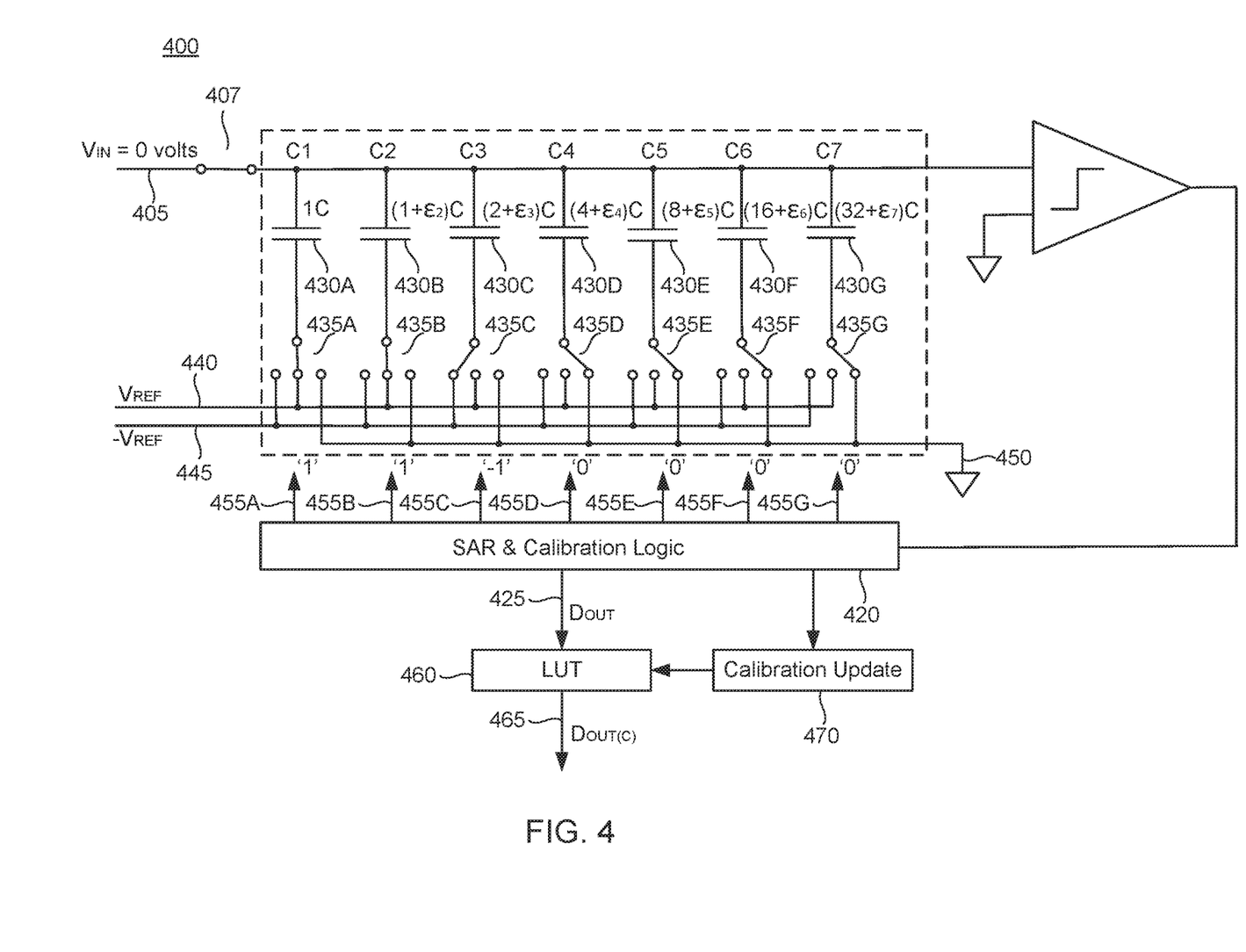
FIG. 4 illustrates a CDAC-based successive approximation ADC during a step in a calibration procedure according to some embodiments of the present disclosure.

FIG. 4 illustrates a CDAC-based successive approximation ADC 400 during step 310 (FIG. 3) in the calibration procedure according to some embodiments of the present disclosure. In FIG. 4, static capacitance error $\varepsilon_3$ is being measured (after $\varepsilon_2$ has already been measured). The specific selection pattern (1, 1, −1, 0, 0, 0, 0) applied to the 3-position switches 435A-435G is illustrated for the selection signals 455A-455G from successive approximation register and calibration logic 420. Each of the '1' selection signals causes $V_{REF}$ 440 to be applied to the bottom plate of the associated capacitor (430A-430G), a selection signal causes $-V_{REF}$ 445 to be applied to the bottom plate of the associated capacitor, and a '0' selection signal causes 0 volts (ground) 450 to be applied to the bottom plate of the associated capacitor. In the embodiment illustrated in FIG. 4, the following table shows the specific selection pattern that may be applied to the 3-position switches 435A-435G for the measurement of each static capacitance error $\varepsilon_i$:

| Static capacitance error | Specific selection pattern |
|---|---|
| $\varepsilon_2$ | (1, −1, 0, 0, 0, 0, 0) |
| $\varepsilon_3$ | (1, 1, −1, 0, 0, 0, 0) |
| $\varepsilon_4$ | (1, 1, 1, −1, 0, 0, 0) |
| $\varepsilon_5$ | (1, 1, 1, 1, −1, 0, 0) |
| $\varepsilon_6$ | (1, 1, 1, 1, 1, −1, 0) |
| $\varepsilon_7$ | (1, 1, 1, 1, 1, 1, −1) |

Figure 5:
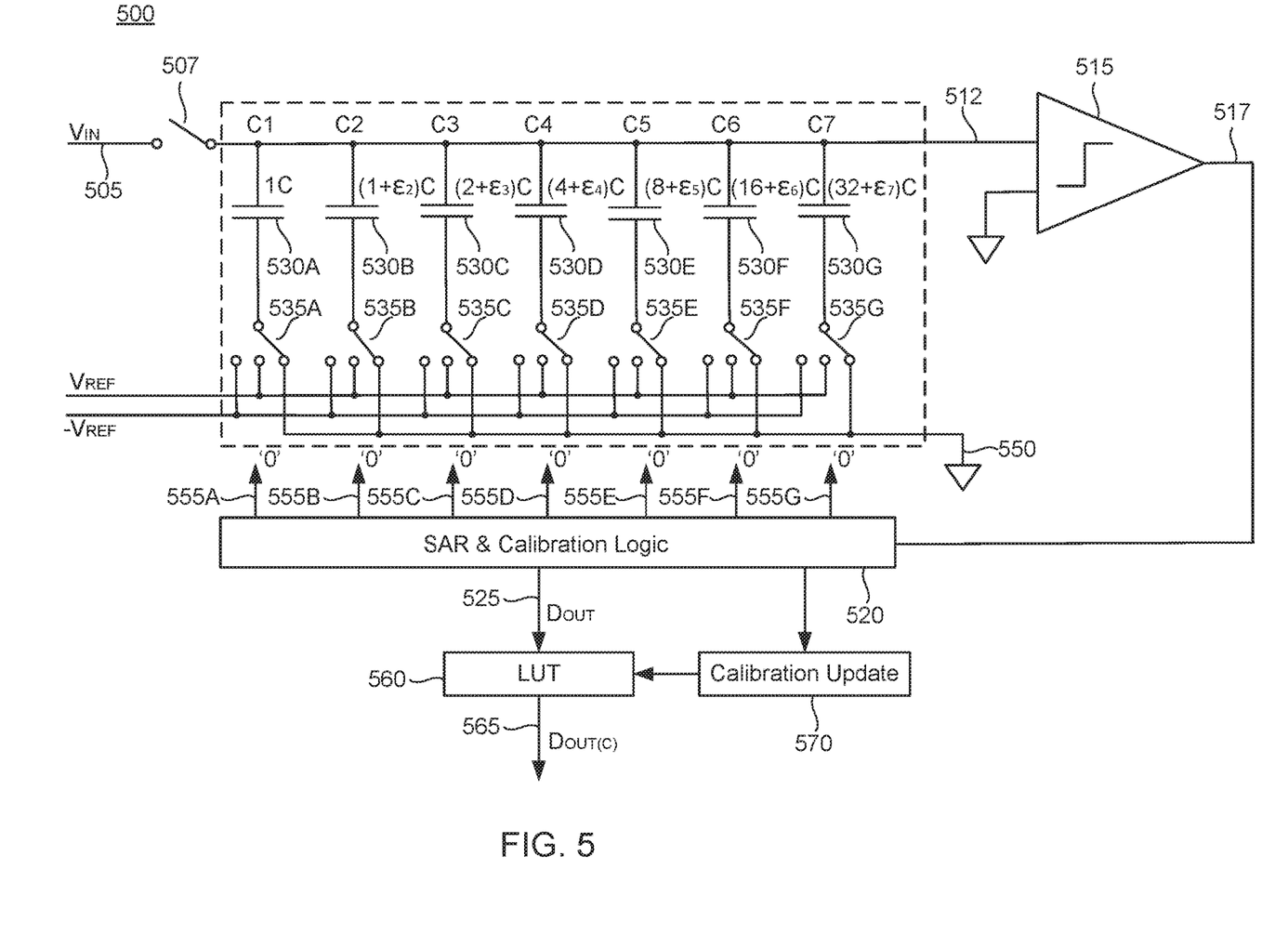
FIG. 5 illustrates a CDAC-based successive approximation ADC during another step in a calibration procedure according to some embodiments of the present disclosure.

Returning to calibration procedure 300 in FIG. 3, and with reference to the CDAC-based successive approximation ADC 500 in FIG. 5, in step 315, the input switch (507 in FIG. 5) is opened and an all '0' pattern is applied to the 3-position switches (535A-535G in FIG. 5). This causes 0 volts (ground) 550 to be applied to the bottom plate of capacitors C1-C7 (530A-530G in FIG. 5) and a voltage $$\left(\varepsilon_i - \sum_{1}^{i-1} \varepsilon_k\right)$$

that is proportional to the sampled static capacitance error $\varepsilon_i$ being measured ($\varepsilon_3 - \varepsilon_2$, based on the specific selection pattern shown in FIG. 4) to appear on the combined top plates of capacitors C1-C7 (530A-530G in FIG. 5) and also on the input 512 of comparator 515.

In step 320, the sampled voltage proportional to static capacitance error $\varepsilon_i$ being measured may be quantized (converted to a digital output) using the normal analog-to-digital conversion functionality of the CDAC-based successive approximation ADC (500 in FIG. 5).

The sampling of the voltage proportional to static capacitance error $\varepsilon_i$ may, in some embodiments, be done once, in which case step 325 may be skipped and in step 330, a single measurement of the static capacitance error $\varepsilon_i$ may be used to derive an adjustment value for updating the look-up table 560. In other embodiments, sampling of the static capacitance error $\varepsilon_i$ may be repeated multiple (M) times (two or more), and averaged, to reduce the effect of white thermal noise and to achieve higher resolution (sub-LSB level) in static capacitance error $\varepsilon_i$ measurements. In step 325, calibration procedure 300 may check if M measurements of the static capacitance error $\varepsilon_i$ have been made. If M measurements have not yet been made, calibration procedure 300 may return to step 310 for another measurement of the static capacitance error K in step 325, M measurements have been made of the static capacitance error $\varepsilon_i$, then calibration procedure 300 continues to step 330. In step 330, the M quantized measurements of a particular static capacitance error $\varepsilon_i$ may be averaged to yield a noise-reduced, higher resolution measurement, and this noise-reduced, higher resolution measurement of the static capacitance error $\varepsilon_i$ may be fed to the calibration update block 570 which, in turn, may use the noise-reduced, higher resolution measurement of the static capacitance error $\varepsilon_i$ to derive an adjustment value for loading into the look-up table 560.

In step 335, calibration procedure 300 may check if all of the static capacitance error $\varepsilon_i$ measurements (N−1 measurements, where N is the number of bits of resolution of the CDAC-based successive approximation ADC) have been made. If all of the measurements have not yet been made, calibration procedure 300 may proceed to step 340, where the specific selection pattern to the 3-position switches is updated to the next predetermined pattern, and then calibration procedure 300 may return to step 310 for measurement of the next static capacitance error $\varepsilon_i$. If, in step 335, all of the measurements have been made of the static capacitance errors $\varepsilon_i$, then calibration procedure 300 completes at step 345.

In the general case, for some embodiments of the present disclosure, the measured, quantized and averaged value of the static capacitance error $\varepsilon_k$ is given by formula (1) below:

$$\varepsilon_{km} = \left\{ \varepsilon_k - \sum_1^{k-1} \varepsilon_i \right\}_M + \sum_1^{k-1} \varepsilon_{im} \quad (1)$$

where $\varepsilon_{km}$ is the measured value of $\varepsilon_k$ and is the average over M values.

The following provides a numerical example of the calibration process described above. A weight vector $\{w_k\}$ may represent the capacitor weights based on the value of the first capacitor (C1). For the capacitors C1-C7 in FIG. 1, the nominal weight vector $\{w_k\}_{k=1\ to\ 7}$=[1 2 4 8 16 32]. For this numerical example, the actual weight vector $\{w_k\}_{k=1\ to\ 7}$=[1 1 2 4 7 18 32]. In this example, there are weight errors in $w_5$ and $w_6$. Using the procedure described above, and illustrated in FIG. 3, the goal is to measure each of the static capacitance errors $\varepsilon_k$ in each weight $w_k$. The calibration order, as discussed above, is from smallest capacitor (C2) to largest capacitor C7 The value of C1 is the reference capacitance. Since the weight $w_k$ of the first four and last capacitances (C1-C4, C7) are accurate, $$\epsilon_{1m} = \epsilon_{2m} = \epsilon_{3m} = \epsilon_{4m} = \epsilon_{7m} = 0. \text{ For } w_5,$$

$$w_5 - \sum_{k=1}^4 w_k = 7 - 8 = -1 = \epsilon_5 - \sum_{k=1}^4 \epsilon_k = \epsilon_5 - 0$$

$$=> \epsilon_{5m} = \left\{ \epsilon_5 - \sum_1^4 \epsilon_i \right\}_M + \sum_1^4 \epsilon_{im} = -1 + 0 = -1$$

And for $w_6$, $w_6 - \sum_{k=1}^5 w_k = 18 - 15 = 3 = \epsilon_6 - \sum_{k=1}^5 \epsilon_k = \epsilon_6 - \epsilon_5 - 0$ $$=> \epsilon_{6m} = \left\{ \epsilon_6 - \sum_1^5 \epsilon_i \right\}_M + \sum_1^5 \epsilon_{im} = 3 + (-1) = 2$$

Therefore the adjustment values to be loaded into the LUT are $\{\in k_m\}_{k=1\ to\ 7}$=[0 0 0 0 -1 2 0]

In some embodiments, an enhanced calibration of CDAC capacitor mismatches may be used to reduce the effects of low frequency noise ($V_f$), including DC offset and flicker noise (1/f), in the CDAC. This low frequency noise ($V_f$) cannot be removed or reduced by mere finite length averaging and may affect the accuracy of the capacitor mismatch error measurements. The effect of low frequency noise ($V_f$) may be reduced by alternately measuring errors $\varepsilon_i$ and the noise signal $V_f$. Referring again to FIG. 5, the measurement of $V_f$ may be made, for example, at the input 512 of comparator 515 with $V_{IN}$ 505 set to 0 volts, the input switch 507 closed and an all '0' pattern applied to the 3-position switches 535A-535G.

Figure 6:
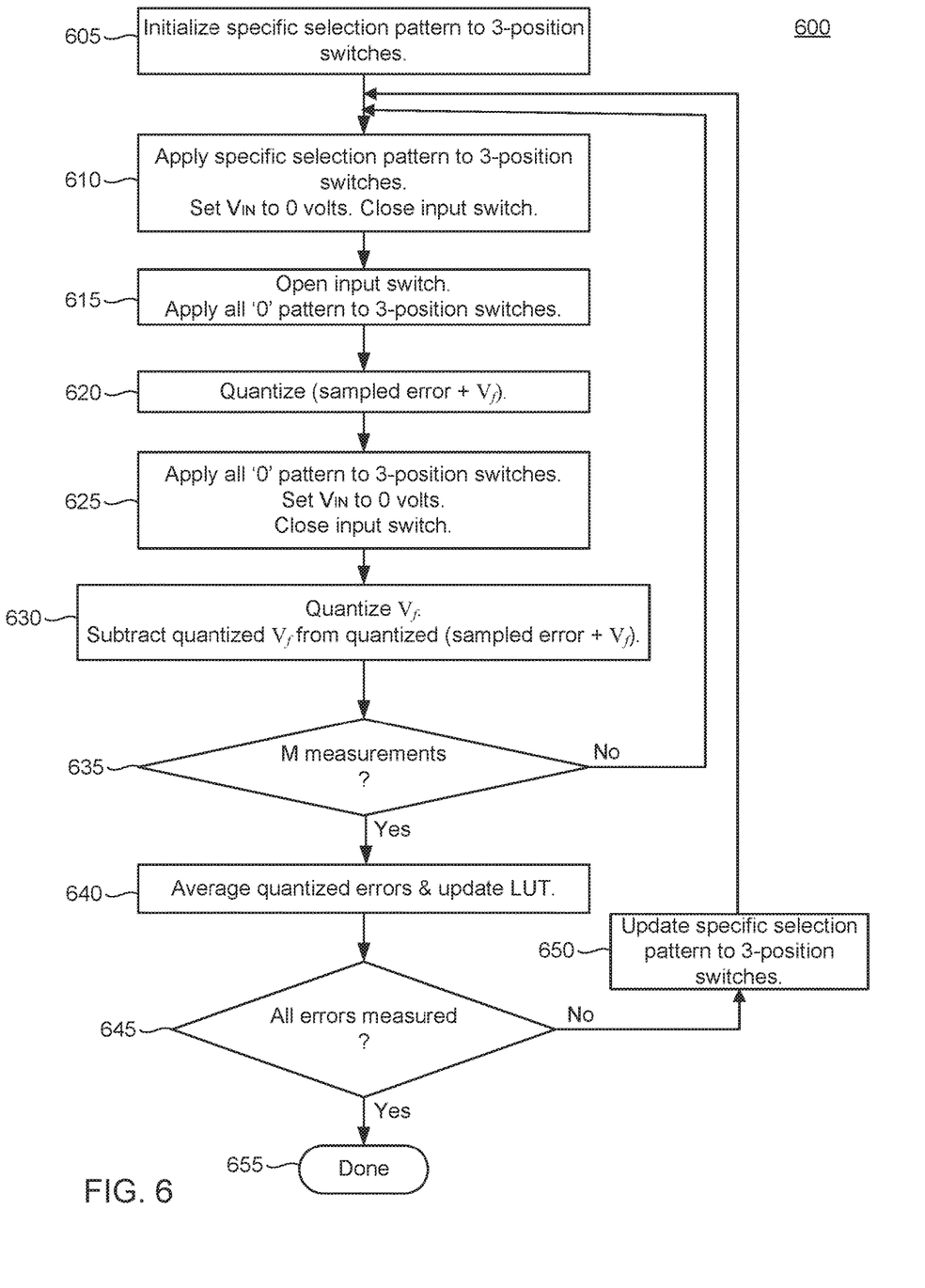
FIG. 6 illustrates another flow diagram of a CDAC-based successive approximation ADC calibration procedure according to an embodiment of the present disclosure.

FIG. 6 illustrates a simplified flow diagram of a CDAC-based successive approximation ADC calibration procedure 600 that includes low frequency noise mitigation according to an embodiment of the present disclosure. Calibration procedure 600 begins at step 605, where a specific selection pattern to be applied to the 3-position switches (235A-235G in FIG. 2) is initialized to a predetermined pattern. In step 610, the specific selection pattern is applied to the 3-position switches (235A-235G in FIG. 2). As with calibration procedure 300, described above, the specific selection pattern will cause a specific set of voltages to be applied to the bottom plates of the capacitors (C1-C7 in FIG. 2) in the CDAC. At the same time, $V_{IN}$ is set to 0 volts and the input switch (207 in FIG. 2) is closed, which applies 0 volts to the combined top plates of the capacitors (C1-C7 in FIG. 2).

In step 615, the input switch (507 in FIG. 5) is opened and an all '0' pattern is applied to the 3-position switches (535A-535G in FIG. 5). This causes 0 volts (ground) 550 to be applied to the bottom plate of capacitors C1-C7 (530A-530G in FIG. 5) and a voltage ($\varepsilon_i - \Sigma_1^{i-1} \varepsilon_k$) that is proportional to the sampled static capacitance error $\varepsilon_i$ being measured ($\varepsilon_3 - \varepsilon_2$, based on the specific selection pattern shown in FIG. 4) plus a sample of the low frequency noise signal ($V_f$) to appear on the combined top plates of capacitors C1-C7 (530A-530G in FIG. 5) and also on the input 512 of comparator 515.

In step 620, the sampled voltage proportional to static capacitance error $\varepsilon_i$ being measured plus the sample of the low frequency noise signal ($V_f$) is quantized (converted to a digital output) using the normal analog-to-digital conversion functionality of the CDAC-based successive approximation ADC (500 in FIG. 5).

In step 625, an all '0' pattern is applied to the 3-position switches (535A-535G in FIG. 5), $V_{IN}$ is set to 0 volts and the input switch (507 in FIG. 5) is closed, which causes 0 volts plus a sample of the low frequency noise signal ($V_f$) to appear on the combined top plates of the capacitors (C1-C7 in FIG. 5) and also on the input 512 of comparator 515.

In step 630, the sample of the low frequency noise signal ($V_f$) is quantized (converted to a digital output) using the normal analog-to-digital conversion functionality of the CDAC-based successive approximation ADC (500 in FIG. 5). After $V_f$ is quantized, it is subtracted from the sum of the quantized sampled static capacitance error $\varepsilon_i$ and the sample of the low frequency noise signal ($V_f$) determined in step 620. This yields a sample of the static capacitance error $\varepsilon_i$ with the low frequency noise signal ($V_f$) removed. Since the measurements are taken closely in time, the low frequency noise doesn't vary significantly. This step also removes any DC offset that may affect the measurement of the static capacitance error.

In step 635, calibration procedure 600 may check if M measurements of the static capacitance error $\varepsilon_i$ and low frequency noise signal ($V_f$) have been made. If M measurements have not yet been made, calibration procedure 600 may return to step 610 for another measurement of the sampled voltage proportional to static capacitance error $\varepsilon_i$ and low frequency noise signal ($V_f$). If M measurements have been made, then calibration procedure 600 continues to step 640. In step 640, the M quantized measurements of a particular static capacitance error $\varepsilon_i$ (with low frequency noise signal removed) may be averaged to yield a noise-reduced, higher resolution measurement, and this noise-reduced measurement of the static capacitance error $\varepsilon_i$ may be fed to the calibration update block 570 (FIG. 5) which, in turn, may use the noise-reduced, higher resolution measurement of the static capacitance error $\varepsilon_i$ to derive an adjustment value for loading into the look-up table 560.

In step 645, calibration procedure 600 may check if all of the static capacitance error $\varepsilon_i$ measurements have been made. If all of the measurements have not yet been made, calibration procedure 600 may proceed to step 650, where the specific selection pattern to the 3-position switches is updated to the next predetermined pattern, and then calibration procedure 600 may return to step 610 for measurement of the next static capacitance error $\varepsilon_i$ and low frequency noise signal ($V_f$). If, in step 645, all of the measurements have been made, then calibration procedure 600 completes at step 655.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

The invention claimed is:

1. An analog-to-digital converter for converting an analog input signal to a digital output comprising:
    a capacitor-based digital-to-analog converter (CDAC) having a group of N capacitors, wherein N is an integer greater than 1;
    a comparator electrically coupled to the CDAC;
    control circuitry electrically coupled to the CDAC and the comparator; and
    a lookup table electrically coupled to the control circuitry, wherein the control circuitry is configured to:
        (a) apply a predetermined pattern of voltages to first plates of the group of N capacitors;
        (b) apply a zero voltage to second plates of the group of N capacitors, wherein the second plates of the group of N capacitors are connected in common;
        (c) remove the zero voltage to the second plates of the group of N capacitors;
        (d) apply a zero voltage to all of the first plates of the group of N capacitors;
        (e) quantize a voltage on the second plates of the group of N capacitors;
        (f) convert the quantized voltage on the second plates of the group of N capacitors to an adjustment value; and
        (g) load the adjustment value into the lookup table.

2. The analog-to-digital converter of claim 1, wherein steps (a) through (g) are repeated N−1 times, wherein the predetermined pattern of voltages is different for each iteration of steps (a) through (g).

3. The analog-to-digital converter of claim 2, wherein each of the predetermined pattern of voltages for each iteration of steps (a) through (g) produces a voltage on the second plates of the group of N capacitors proportional to a mismatch error in one of the group of N capacitors.

4. The analog-to-digital converter of claim 3, wherein the adjustment value loaded into the lookup table provides a correction for the mismatch error in one of the group of N capacitors.

5. The analog-to-digital converter of claim 1, wherein steps (a) through (e) are repeated M times, wherein M is an integer greater than 1, and wherein M quantized voltages from each iteration of steps (a) through (e) are averaged in step (f) to yield the quantized voltage.

6. The analog-to-digital converter of claim 1, wherein the control circuitry is further configured to perform a binary search through all possible quantization levels before converging on a digital output.

7. A method for calibrating a CDAC-based analog-to-digital converter comprising:
    (a) applying a predetermined pattern of voltages to first plates of a group of N capacitors, wherein N is an integer greater than 1;
    (b) applying a zero voltage to second plates of the group of N capacitors, wherein the second plates of the group of N capacitors are connected in common;
    (c) removing the zero voltage to the second plates of the group of N capacitors;
    (d) applying a zero voltage to all of the first plates of the group of N capacitors;
    (e) quantizing a voltage on the second plates of the group of N capacitors;
    (f) converting the quantized voltage on the second plates of the group of N capacitors to an adjustment value; and
    (g) loading the adjustment value into a lookup table.

8. The method of claim 7, wherein steps (a) through (g) are repeated N−1 times, wherein the predetermined pattern of voltages is different for each iteration of steps (a) through (g).

9. The method of claim 8, wherein each of the predetermined pattern of voltages for each iteration of steps (a) through (g) produces a voltage on the second plates of the group of N capacitors proportional to a mismatch error in one of the group of N capacitors.

10. The method of claim 9, wherein the adjustment value loaded into the lookup table provides a correction for the mismatch error in one of the group of N capacitors.

11. The method of claim 7, wherein steps (a) through (e) are repeated M times, wherein M is an integer greater than 1, and wherein M quantized voltages from each iteration of steps (a) through (e) are averaged in step (f) to yield the quantized voltage.

12. The method of claim 7, wherein the predetermined pattern of voltages includes a positive reference voltage, a negative reference voltage and a zero voltage.

13. The method of claim 8, wherein the quantizing in steps performed by the CDAC-based analog-to-digital converter.

14. A CDAC-based analog-to-digital converter for converting an analog input signal to a digital output comprising:
    a capacitor-based digital-to-analog converter (CDAC) having a group of N capacitors, wherein N is an integer greater than 1;
    a comparator electrically coupled to the CDAC;
    control circuitry electrically coupled to the CDAC and the comparator; and
    a lookup table electrically coupled to the control circuitry, wherein the control circuitry is configured to:
        (a) apply a predetermined pattern of voltages to first plates of the group of N capacitors;
        (b) apply a zero voltage to second plates of the group of N capacitors, wherein the second plates of the group of N capacitors are connected in common;
        (c) remove the zero voltage to the second plates of the group of N capacitors;
        (d) apply a zero voltage to all of the first plates of the group of N capacitors;
        (e) quantize a first voltage on the second plates of the group of N capacitors;
        (f) apply a zero voltage to the second plates of the group of N capacitors;
        (g) apply a zero voltage to all of the first plates of the group of N capacitors;
        (h) quantize a second voltage on the second plates of the group of N capacitors;

(i) subtract the quantized second voltage on the second plates of the group of N capacitors from the quantized first voltage on the second plates of the group of N capacitors to yield a difference;

(j) convert the difference to an adjustment value; and (k) load the adjustment value into the lookup table.

15. The analog-to-digital converter of claim 14, wherein steps (a) through (k) are repeated N−1 times, wherein the predetermined pattern of voltages is different for each iteration of steps (a) through (k).

16. The analog-to-digital converter of claim 15, wherein each of the predetermined pattern of voltages for each iteration of steps (a) through (e) produces the first voltage on the second plates of the group of N capacitors that is proportional to a mismatch error in one of the group of N capacitors plus low frequency noise, and wherein each iteration of steps (f) through (h) produces the second voltage on the second plates of the group of N capacitors that is proportional to the low frequency noise, and wherein step (i) removes the low frequency noise from the mismatch error.

17. The analog-to-digital converter of claim 16, wherein the adjustment value loaded into the lookup table provides a correction for the mismatch error in one of the group of N capacitors.

18. The analog-to-digital converter of claim 14, wherein steps (a) through (i) are repeated M times, wherein M is an integer greater than 1, and wherein M differences from each iteration of steps (a) through (i) are averaged in step (j) to yield the difference converted to the adjustment value.

19. The analog-to-digital converter of claim 14, wherein the control circuitry is further configured to perform a binary search through all possible quantization levels before converging on a digital output.

20. The analog-to-digital converter of claim 14, wherein the quantizing in steps (e) and h is performed by the CDAC-based analog-to-digital converter.

\* \* \* \* \*